United States Patent
Koo et al.

(10) Patent No.: US 8,987,718 B2
(45) Date of Patent: Mar. 24, 2015

(54) DUAL MODE DISPLAY DEVICES AND METHODS OF MANUFACTURING THE SAME

(71) Applicant: Electronics and Telecommunications Research Institute, Daejeon (KR)

(72) Inventors: Jae Bon Koo, Daejeon (KR); Hojun Ryu, Seoul (KR); Chi-Sun Hwang, Daejeon (KR); Jeong Ik Lee, Gunpo-si (KR); Hye Yong Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/763,383

(22) Filed: Feb. 8, 2013

(65) Prior Publication Data

US 2014/0014915 A1    Jan. 16, 2014

(30) Foreign Application Priority Data

Jul. 12, 2012    (KR) .................. 10-2012-0076275

(51) Int. Cl.
*H01L 29/08*    (2006.01)
*H01L 51/52*    (2006.01)
*H01L 51/56*    (2006.01)

(52) U.S. Cl.
CPC ............ *H01L 51/5203* (2013.01); *H01L 51/56* (2013.01)
USPC ............................................. 257/40; 257/98

(58) Field of Classification Search
CPC ...... H01L 51/5203; H01L 51/56; H01L 51/50
USPC ............ 257/40, 76, 98, E33.023; 438/27, 82
See application file for complete search history.

(56) References Cited

U.S. PATENT DOCUMENTS

| | | | |
|---|---|---|---|
| 6,542,145 B1 * | 4/2003 | Reisinger et al. | 345/102 |
| 7,170,506 B2 | 1/2007 | Eldon et al. | |
| 2006/0019026 A1 * | 1/2006 | Lee et al. | 427/66 |
| 2007/0291204 A1 * | 12/2007 | Otake | 349/114 |
| 2010/0238966 A1 * | 9/2010 | Mochizuki | 372/99 |
| 2011/0267279 A1 | 11/2011 | Rivera et al. | |
| 2012/0007100 A1 * | 1/2012 | Jung et al. | 257/76 |
| 2012/0140304 A1 * | 6/2012 | Kuhlman et al. | 359/228 |
| 2012/0147452 A1 * | 6/2012 | Park et al. | 359/296 |
| 2013/0208195 A1 * | 8/2013 | Cho et al. | 349/15 |
| 2013/0271411 A1 * | 10/2013 | Kuo et al. | 345/173 |

FOREIGN PATENT DOCUMENTS

KR    10-2008-0112673 A    12/2008

* cited by examiner

*Primary Examiner* — Jarrett Stark
*Assistant Examiner* — Shahed Ahmed

(57) ABSTRACT

Disclosed are dual mode display devices and methods of manufacturing the same. The dual mode display device may include a first substrate, a first electrode on the first substrate, a second substrate opposite to the first electrode and the first substrate, a second electrode between the second substrate and the first electrode, a third electrode between the first electrode and the second electrode, an optic switching layer between the first electrode and the third electrode, and an organic light-emitting layer between the second electrode and the third electrode.

16 Claims, 8 Drawing Sheets

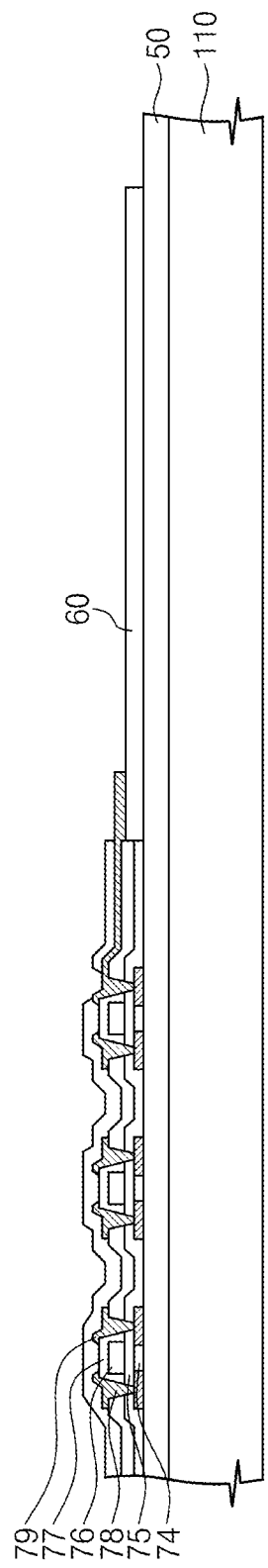

DUAL MODE DISPLAY DEVICES AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2012-0076275, filed on Jul. 12, 2012, the entirety of which is incorporated by reference herein.

BACKGROUND

The inventive concept relates to display devices and methods of manufacturing the same and, more particularly, to dual mode display devices of a reflection type and a self-light-emitting type and methods of manufacturing the same.

A flat panel display (FPD) industry may be important with the development of information age. The FPD may display an image by controlling an intensity of transmitted light or self-emitting light according to image controlling signals. The FPDs may include a liquid crystal display (LCD) and an organic light-emitting display (OLED).

The LCDs may be categorized as any one of a transmission type LCD and a reflection type LCD. In the transmission type LCD, white light generated from a back light unit may be transmitted through two polarizing plates and a liquid crystal layer, so as to be modulated. The white light may pass through a color filer to realize a color. Since the reflection type LCD may be driven in a low voltage, it may be widely applied to a mobile device, a notebook, a computer, a monitor, and a television. The transmission type LCD may use a portion of the white light transmitted through the polarizing plates and the color filer, so that light efficiency of the transmission type LCD may be low. Additionally, the back light unit may increase power consumption of the transmission type LCD. Thus, various researches have been conducted for the reflection type LCD from which the back light unit is removed. The reflection type LCD may show an image by reflecting an external light in bright surroundings.

The OLED has been spotlighted because of low power consumption and self-emitting properties thereof. The OLED may include a plurality of substrates opposite to each other, a plurality of electrodes disposed between the substrate, and an organic light-emitting material. The substrates may include flexible substrates such as plastic. Thus the OLED may be realized as a stretchable display. The organic light-emitting material may form excitons being pairs of electrons and holes supplied through the electrodes. The excitons may emit light in the organic light-emitting material. Thus, the OLED may show the image by self-emitting light.

The OLED may be combined with the reflection type LCD to realize a dual mode display device. The dual mode display device may adapt to an external environment to actualize super-saving electric power.

SUMMARY

Embodiments of the inventive concept may provide dual mode display devices having self-light-emitting mode and reflection mode and methods of manufacturing the same.

Embodiments of the inventive concept may also provide dual mode display devices capable of improving productivity and methods of manufacturing the same.

In one aspect, a dual mode display device may include: a first substrate; a first electrode on the first substrate; a second substrate opposite to the first electrode and the first substrate; a second electrode between the second substrate and the first electrode; a third electrode between the first electrode and the second electrode; an optic switching layer between the first electrode and the third electrode; and an organic light-emitting layer between the second electrode and the third electrode.

In some embodiments, the dual mode display device may further include: a passivation layer disposed between the third electrode and the optic switching layer.

In other embodiments, the dual mode display device may further include: an adhesive layer disposed between the passivation layer and the optic switching layer.

In even other embodiments, the adhesive layer may include a polymer film.

In yet other embodiments, the dual mode display device may further include: a thin film transistor part adjacent to the third electrode and disposed between the passivation layer and the organic light-emitting layer.

In yet still other embodiments, the optic switching layer may include photonic crystal capsules.

In further embodiments, the optic switching layer may include electronic-ink microcapsules.

In still further embodiments, the optic switching layer may include a liquid crystal layer.

In even further embodiments, the first electrode may be a transparent electrode; and the second electrode may be a reflecting electrode.

In yet further embodiments, the first electrode may be a reflecting electrode; and the second electrode may be a transparent electrode.

In another aspect, a method of manufacturing a dual mode display device may include: forming a passivation layer on a dummy substrate; forming a thin film transistor part and a third electrode connected to the thin film transistor part on the passivation layer; forming an organic light-emitting layer on the third electrode and the thin film transistor parts; forming a second electrode on the organic light-emitting layer; forming a second substrate covering the second electrode; removing the dummy substrate; forming a first electrode on a first substrate opposite to the second substrate; and bonding the first substrate to the second substrate with an optic switching layer inserted between the first electrode and the passivation layer.

In some embodiments, the dummy substrate may be removed by a dry etching process, a wet etching process, or a chemical mechanical polishing process.

In other embodiments, bonding the first substrate to the second substrate may include: forming the optic switching layer on the first electrode; forming an adhesive layer on the optic switching layer; and bonding the adhesive layer to the passivation layer.

BRIEF DESCRIPTION OF THE DRAWINGS

The inventive concept will become more apparent in view of the attached drawings and accompanying detailed description.

FIGS. 4 to 12 are cross-sectional views illustrating methods of manufacturing dual mode display devices according to first and second embodiments of the inventive concept.

DETAILED DESCRIPTION OF THE EMBODIMENTS

Figure 1:
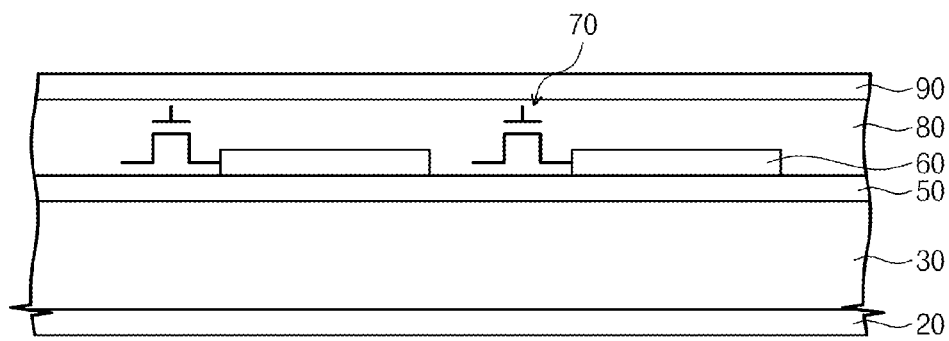
FIG. 1 is a schematic cross-sectional view illustrating a display device according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

FIG. 1 is a schematic cross-sectional view illustrating a display device according to embodiments of the inventive concept.

Referring to FIG. 1, a display device according to embodiments of the inventive concept includes a first electrode 20, a second electrode 90 on the first electrode 20, a third electrode 60 between the first electrode 20 and the second electrode 90, an optic switching layer 30 between the first electrode 20 and the third electrode 60, an organic light-emitting layer 80 between the second electrode 90 and the third electrode 60, and a passivation layer 50 between the organic light-emitting layer 80 and the optic switching layer 30.

The first electrode 20 and the second electrode 90 may be cathodes applying negative voltages to the optic switching layer 30 and the organic light-emitting layer 80, respectively. The third electrode 60 may be a common anode applying a positive voltage to the he optic switching layer 30 and the organic light-emitting layer 80.

A thin film transistor part 70 is disposed between the optic switching layer 30 and the organic light-emitting layer 80. The thin film transistor part 70 is connected to the third electrode 60. The thin film transistor part 70 and the third electrode 60 are fixed on the passivation layer 50. The passivation layer 50 may separate the optic switching layer 30 from the organic light-emitting layer 80.

The organic light-emitting layer 80 may emit self-emitting light by a bias current between the second electrode 90 and the third electrode 60. The organic light-emitting layer 80 may perform a self-light-emitting mode of the display device. The display device may effectively show a self-light-emitting mode image in a dark room. Even though not shown in the drawings, the organic light-emitting layer 80 may include a hole injecting layer, a hole transporting layer, a light-emitting layer, an electron transporting layer, and an electron injecting layer which are disposed on the third electrode 60.

The optic switching layer 30 may absorb or transmit external light. The absorption or transmission of the external light may be determined by an electric field in the optic switching layer 30. The electric field is induced between the first electrode 20 and the third electrode 60. The optic switching layer 30 is driven in a reflection mode of the display device. The display device may show a reflection mode image in a bright space.

Thus, the display device according to the inventive concept may realize a dual mode. The dual mode display device may minimize energy consumption. The dual mode display device may display the image in back or front of the dual mode display device according to reflexibility and/or transmissivity of the first electrode 20 or the second electrode 90. These will be described with reference to FIGS. 2 and 3 in more detail.

Figure 2:
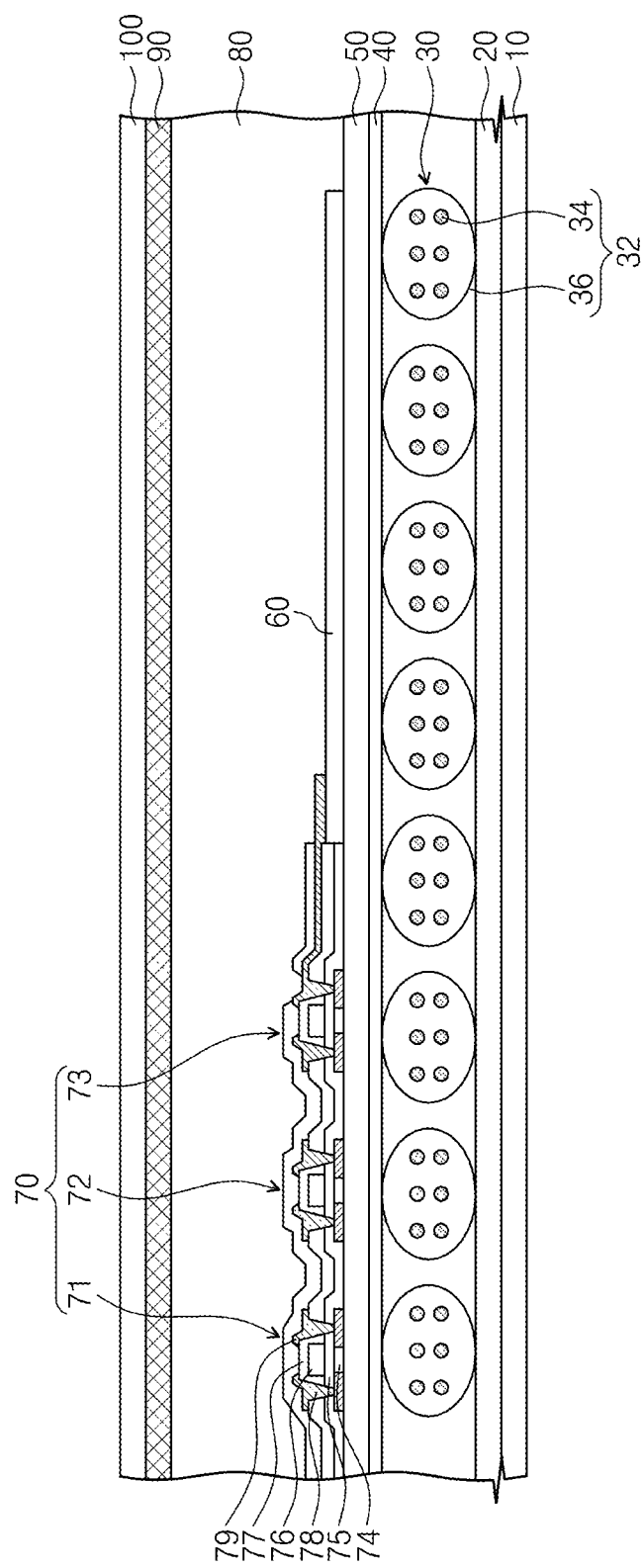
FIG. 2 is a cross-sectional view illustrating a dual mode display device according to a first embodiment of the inventive concept.

FIG. 2 is a cross-sectional view illustrating a dual mode display device according to a first embodiment of the inventive concept.

Referring to FIG. 2, a dual mode display device according to the first embodiment may display the image in back thereof. The dual mode display device may include a first substrate 10 and a second substrate 100. One surface of the first substrate 10 corresponds to a back side of the dual mode display device, and one surface of the second substrate 100 corresponds to a front side of the dual mode display device. In other words, the dual mode display device according to the first embodiment may display the image in a backward direction from the second substrate 100 toward the first substrate 10. The first electrode 20 is a transparent electrode transmitting the self-emitting light and the external light, and the second electrode 90 a reflecting electrode reflecting the self-emitting light and the external light.

The first electrode 20 may include at least one of transparent metals (e.g., indium tin oxide (ITO) and indium zinc oxide (IZO)) and transparent conductive materials (e.g., a silver nano-wire, a carbon nano-tube, graphene, PEDOT:PSS, polyaniline, and polythiophene).

The second electrode 90 may include at least one of opaque metals such as tungsten (W), aluminum (Al), and silver (Ag). The first electrode 20 and the second electrode 90 may be fixed on the first substrate 10 and the second substrate 100, respectively. Each of the first substrate 10 and the second substrate 100 may include a transparent glass or plastic.

The third electrode 60 is a pixel electrode defining a sub-pixel. The third electrode 60 may include a transparent metal such as ITO or IZO.

The thin film transistor part 70 may include a sampling thin film transistor 71, a driving thin film transistor 72, and a programming thin film transistor 73. Each of the sampling thin film transistor 71, the driving thin film transistor 72, and the programming thin film transistor 73 may include an active layer 74, a gate insulating layer 75 on the active layer 74 and the passivation layer 50, a gate electrode 76 on the gate insulating layer 75 disposed on the active layer 74, a gate upper insulating layer 75 disposed on the gate electrode 76 and the gate insulating layer 75, and source/drain electrodes 78 and 79. The source/drain electrodes 78 and 79 may be disposed at both sides of the gate electrode 76, respectively. The source/drain electrodes 78 and 79 may penetrate the gate upper insulating layer 77 and the gate insulating layer 75, so as to be connected to the active layer 76. FIG. 2 shows the thin film transistor part 70 having a top gate structure. However, the inventive concept is not limited thereto. In other embodiments, the thin film transistor part 70 may have a bottom gate structure.

The thin film transistor part 70 may control a bias voltage and a bias current applied to the third electrode 60. The bias voltage is a turned-on data signal in response to a gate signal. The sampling thin film transistor 71 may control the bias voltage. The data signal and the gate signal may be applied through a data line (not shown) and a gate line (not shown), respectively. The bias current may be applied to the third electrode 60 from a current source (not shown).

The driving thin film transistor 72 and the programming thin film transistor 73 may control the bias current. In FIG. 2, the third electrode 60 is connected to a drain electrode 79 of the programming thin film transistor 73. However, the inventive concept is not limited thereto. In other embodiments, the sampling thin film transistor 71 and the programming thin film transistor 73 may be connected in common to the third electrode 60.

The first electrode 20 transmits the external light and a reflected light, and the second electrode 90 reflects the external light. The optic switching layer 30 may not transmit the external light and the reflected light when the electric field is not generated between the first electrode 20 and the third electrode 60. The bias voltage may induce the electric field between the first electrode 20 and the third electrode 60. The optic switching layer 30 may transmit the external light and the reflected light when the electric field is generated between the first and third electrodes 20 and 60. However, the inventive concept is not limited thereto.

At this time, the second electrode 90 is in a floating state. The driving thin film transistor 72 and the programming thin film transistor 73 may be turned-off. Additionally, the current source does not supply the bias current. When the organic light-emitting layer 80 is transparent, the reflection mode image may be shown in black, white, or color. If the organic light-emitting layer 80 has a color, the reflection mode image may be shown in color.

The optic switching layer 30 may include electronic-ink microcapsules 32 or photonic crystal capsules. Example, the electronic-ink microcapsules 32 may include electronic-ink particles 34 and a capsule 36. The electronic-ink particles 34 may be densely disposed in the capsule 36. At this time, the optic switching layer 30 may transmit the external light and the self-emitting light. On the other hand, if an electric field is induced between the first electrode 20 and the third electrode 60, the electronic-ink particles 34 may be widely dispersed in the capsule 36. Thus, the switching capsules 32 may block the external light and the self-emitting light. The optic switching layer 30 may include a liquid crystal layer. The liquid crystal layer may include any one of nematic liquid crystal, smectic liquid crystal, and cholesteric liquid crystal.

An adhesive layer 40 is disposed between the optic switching layer 30 and the passivation layer 50. The adhesive layer 40 fixes the capsules 36. Additionally, the adhesive layer 40 may increase electric characteristics between the first electrode 20 and the third electrode 60. The adhesive layer 40 may include a polymer film having resistivity and a dielectric constant equal to or less than predetermined values. The passivation layer 50 may include a transparent dielectric layer such as a silicon oxide layer or a silicon oxynitride layer. The adhesive layer 40 may be a laminated liquid crystal protecting film.

The organic light-emitting layer 80 may include a transparent material. The organic light-emitting layer 80 may transmit external light or reflected light of a white color. The organic light-emitting layer 80 may have one of three primary colors. The organic light-emitting layer 80 may give a color to the external light or the reflected light. The organic light-emitting layer 80 may include an electron transporting layer, a hole transporting layer, and a light-emitting layer. The light-emitting layer may emit the self-emitting light of a red color, a green color, or a blue color. The intensity of the self-emitting light may increase in proportion to the bias current. At this time, the first electrode 20 is in a floating state. The first electrode 20 and the optic switching layer 30 may transmit the self-emitting light. An image of the self-light-emitting mode may be transmitted through the optic switching layer 30 and then be shown in back of the dual mode display device.

As a result, the dual mode display device according to the first embodiment may display the image of the reflection mode or the self-light-emitting mode in back thereof.

Figure 3:
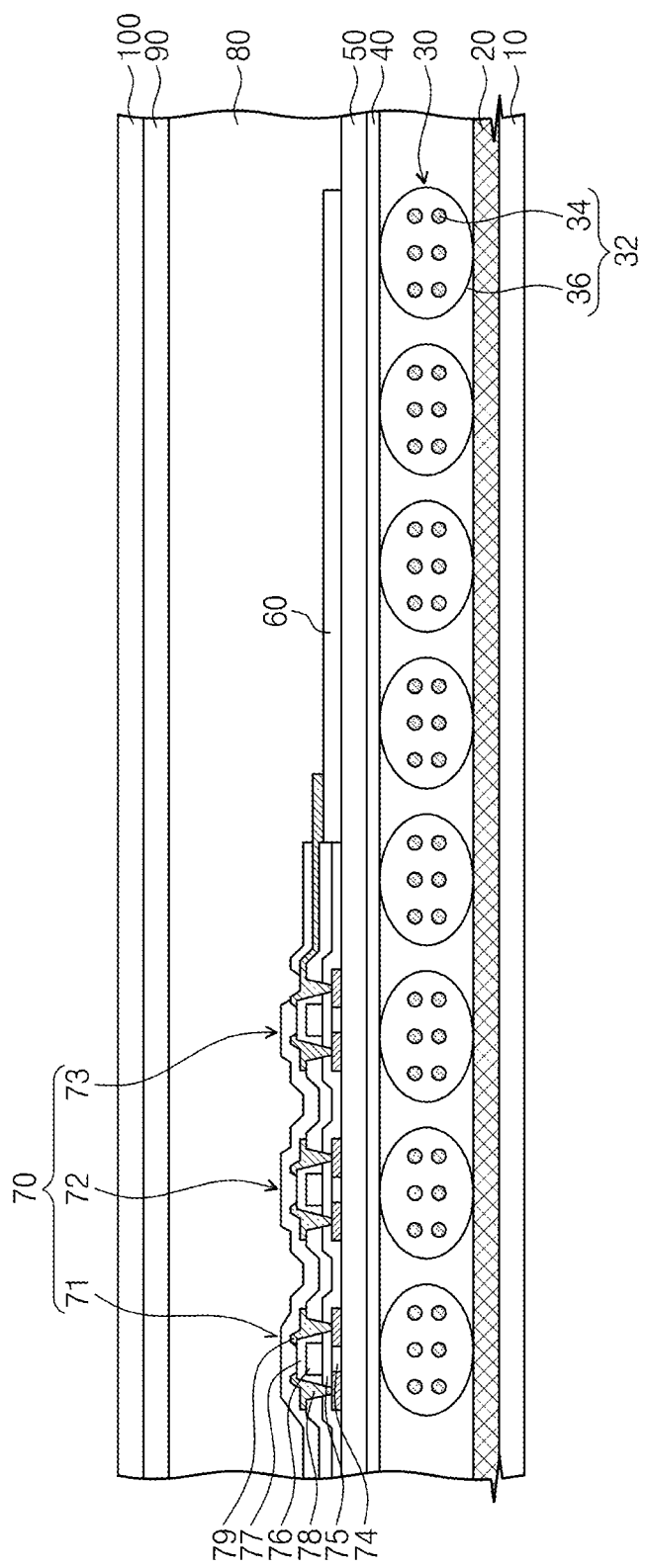
FIG. 3 is a cross-sectional view illustrating a dual mode display device according to a second embodiment of the inventive concept.

FIG. 3 is a cross-sectional view illustrating a dual mode display device according to a second embodiment of the inventive concept.

Referring to FIG. 3, a dual mode display device according to the second embodiment may display an image in front thereof. In other words, the dual mode display device according to the second embodiment may display the image in a direction from the first substrate 10 toward the second substrate 100. In the present embodiment, the first electrode 20 is a reflecting electrode, and the second electrode 90 is a transparent electrode. The first electrode 20 may include an opaque metal. The opaque metal may include at least one of tungsten (W), aluminum (Al), and silver (Ag). The second electrode 90 may include at least one of indium tin oxide (ITO), indium zinc oxide (IZO), a silver nano-wire, a carbon nano-tube, graphene, PEDOT:PSS, polyaniline, and polythiophene.

The organic light-emitting layer 80 may display the image of the self-light-emitting mode in front of the dual mode display device according to the second embodiment. The organic light-emitting layer 80 may include a transparent material. The reflection mode may realize a black, white, or color image. If the organic light-emitting layer 80 has any one of three primary colors, the dual mode display device may display the color image of the reflection mode in front thereof.

The first electrode 20 is the transparent electrode and the second electrode 90 is the reflecting electrode in the first embodiment. On the other hand, the first electrode 20 is the reflecting electrode and the second electrode 90 is the transparent electrode in the second embodiment.

Hereinafter, methods of manufacturing the dual mode display devices according to the first and second embodiments will be described with reference to FIGS. 4 to 12.

FIGS. 4 to 12 are cross-sectional views illustrating methods of manufacturing dual mode display devices according to first and second embodiments of the inventive concept.

Referring to FIG. 4, the passivation layer 50 is formed on a dummy substrate 110. The passivation layer 50 may be formed by a chemical vapor deposition (CVD) process or a rapid thermal treatment process. The passivation layer 50 may include a silicon oxide layer, a silicon nitride layer, or a silicon oxynitride layer. The dummy substrate 110 may include a glass substrate or a plastic substrate.

Referring to FIG. 5, the thin film transistor part 70 and the third electrode 60 are formed on the passivation layer 50. The thin film transistor part 70 may be formed by a plurality of unit processes. The unit processes may include a deposition process, a photolithography process, and an etching process.

The thin film transistor part 70 may include an active layer 74, source/drain electrodes 78 and 79, a gate insulating layer 75, a gate upper insulating layer 77, and a gate electrode of a metal 76. The active layer 74 may include poly-silicon. The gate insulating layer 75 may include a dielectric layer such as a silicon oxide layer. Each of the poly-silicon and the dielectric layer may be formed by a CVD process. The poly-silicon may be patterned by a photolithography process and an etching process. The source/drain electrodes 78 and 79 and the gate electrode 76 may include a transparent metal such as ITO. The metals for the source/drain electrodes 78 and 70 and the gate electrode 76 may be formed by a deposition process such as a sputtering process. The metals for the source/drain electrodes 78 and 70 and the gate electrode 76 may be patterned by a photolithography process and an etching process.

The third electrode 60 may include a transparent metal such as ITO or IZO. The transparent metal may be formed by a physical vapor deposition (PVD) process such as a sputtering process or a molecular beam epitaxy (MBE) process. The transparent metal may be patterned by a photolithography process and an etching process. At this time, the transparent metal for the third electrode 60 may be formed by the same deposition process as one of the gate electrode 76 and the source/drain electrodes 78 and 79. Alternatively, the transparent metal for the third electrode 60 may be formed by an additional deposition process. In other embodiments, the third electrode 60 may include a transparent conductive material such as a silver nano-wire, a carbon nano-tube, graphene, PEDOT:PSS, polyaniline, and/or polythiophene. The transparent conductive material may be formed by a CVD process, a spin coating process, or an implanting process.

Figure 6:
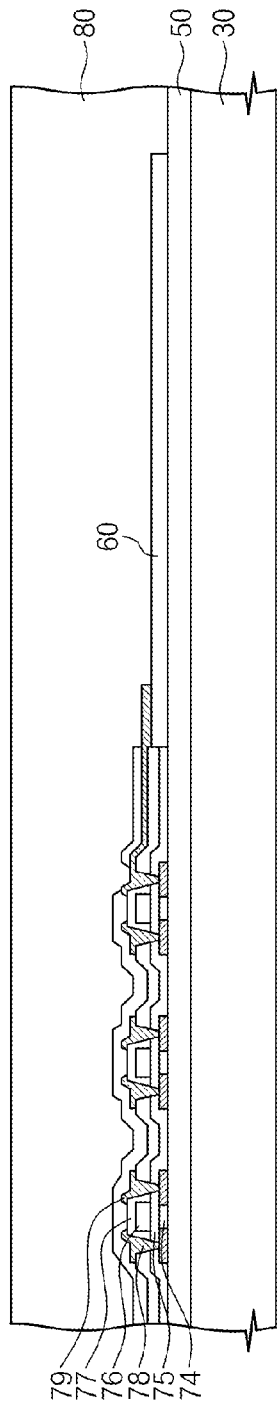

Referring to FIG. 6, the organic light-emitting layer 80 is formed on the thin film transistor 70 and the third electrode 60. The organic light-emitting layer 80 may be formed by a spin coating process, a sol-gel process, a thermal deposition process, or a CVD process.

Figure 7:
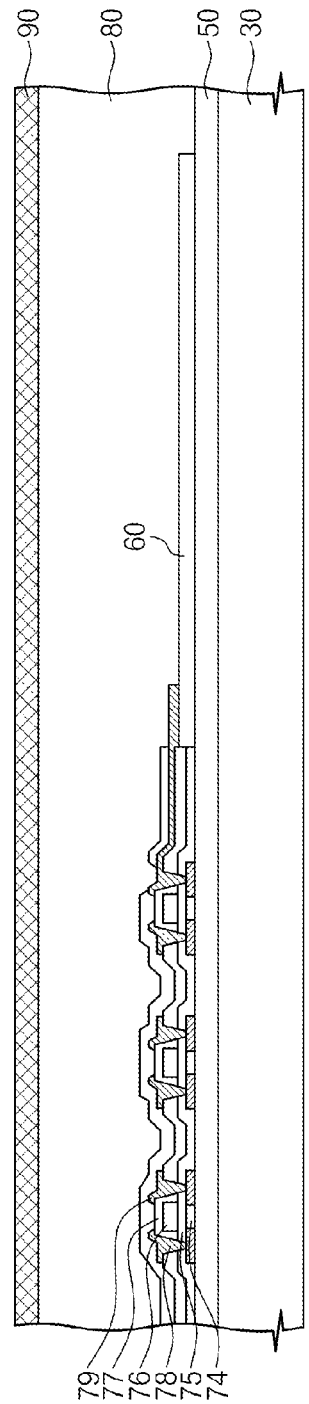

Referring to FIG. 7, the second electrode 90 is formed on the organic light-emitting layer 80. The second electrode 90 may be formed of a transparent metal, an opaque metal, or a transparent conductive material by a PVD process or a CVD process. According to a first embodiment of the inventive concept, the second electrode 90 may be formed of the opaque metal having high reflexibility. The opaque metal may include tungsten (W), aluminum (Al), or silver (Ag). According to a second embodiment of the inventive concept, the second electrode 90 may be formed of the transparent metal or the transparent conductive material. The transparent metal may include ITO, IZO, or a silver nano-wire. The transparent conductive material may include a carbon nano-tube, graphene, PEDOT:PSS, polyaniline, and/or polythiophene. The graphene may be formed by a tape laminating process.

Figure 8:
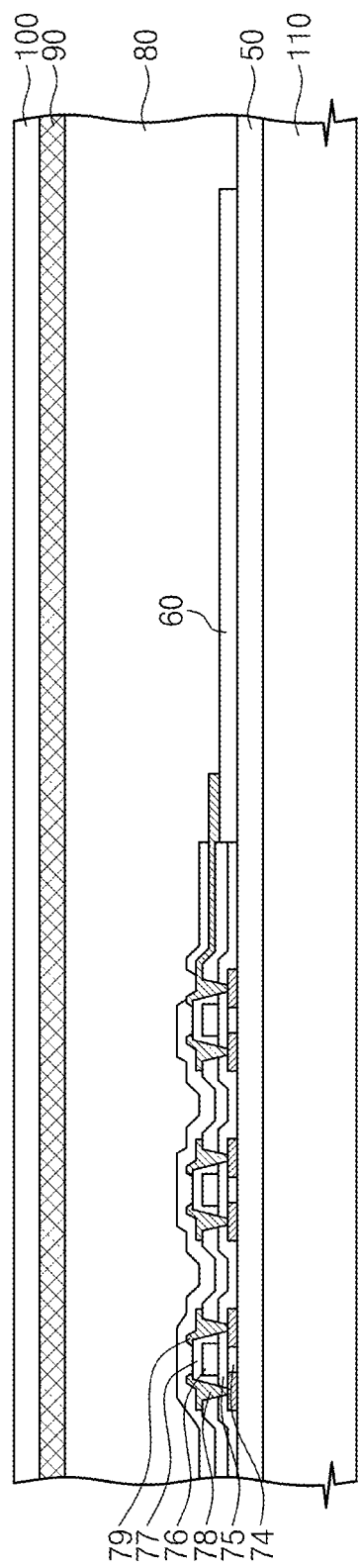

Referring to FIG. 8, the second substrate 100 may be provided on the second electrode 90. The second substrate 100 may include glass or plastic. The plastic has flexibility. Even though not shown in the drawings, the second electrode 90 may be formed on the second substrate 100 and then the second electrode 90 formed on the second substrate 100 may be bonded to the organic light-emitting layer 80.

Figure 9:
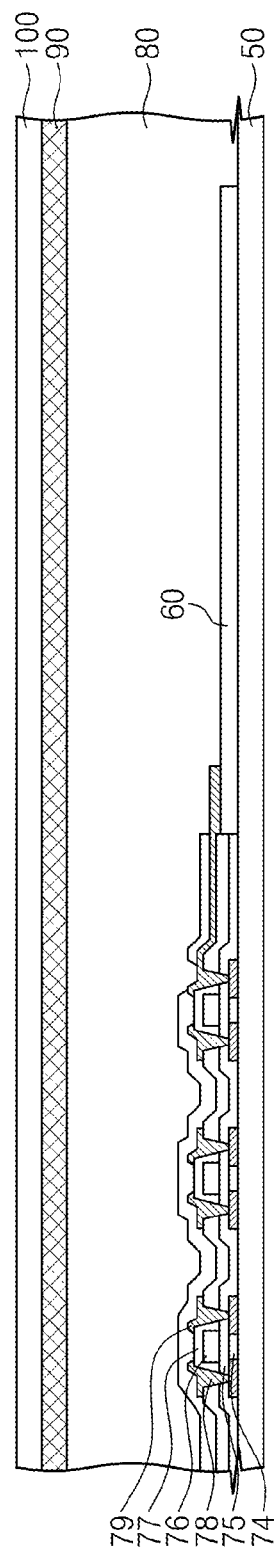

Referring to FIG. 9, the dummy substrate 110 is removed. The dummy substrate 110 may be removed by a wet etching process, a dry etching process, or a chemical mechanical polishing (CMP) process. The passivation layer 50 may function as an etch stop layer in the removal process of the dummy substrate 110.

Figure 10:
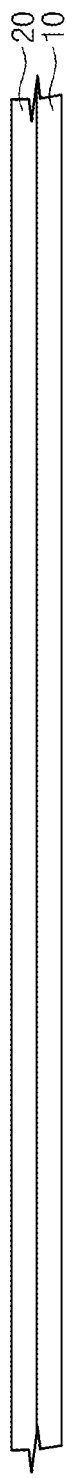

Referring to FIG. 10, the first electrode 20 is formed on the first substrate 10 opposite to the second substrate 100. The first electrode 20 may be formed of a transparent metal, a transparent conductive material, or an opaque metal by a PVD process or a CVD process. According to the first embodiment of the inventive concept, the first electrode 20 may include the transparent metal or the transparent conductive material. According to the second embodiment of the inventive concept, the first electrode 20 may include the opaque metal.

Figure 11:
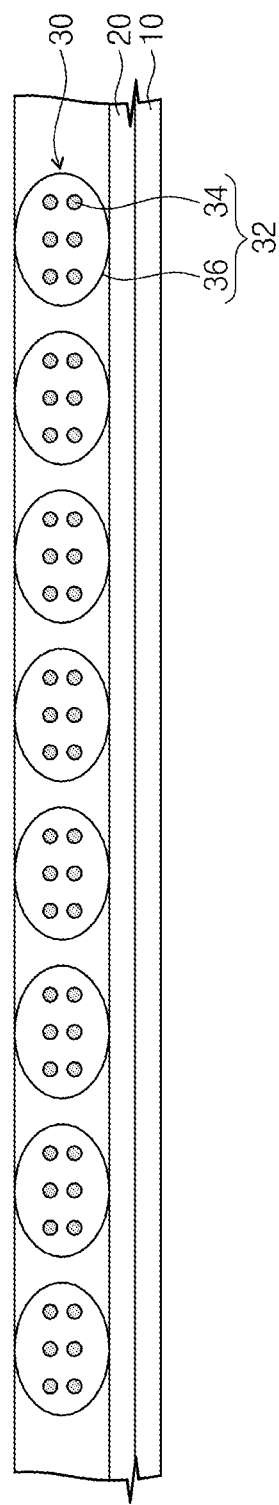

Referring to FIG. 11, the optic switching layer 30 is formed on the first electrode 20. The optic switching layer 30 may be formed on the first electrode 20 by a dropping process.

Figure 12:
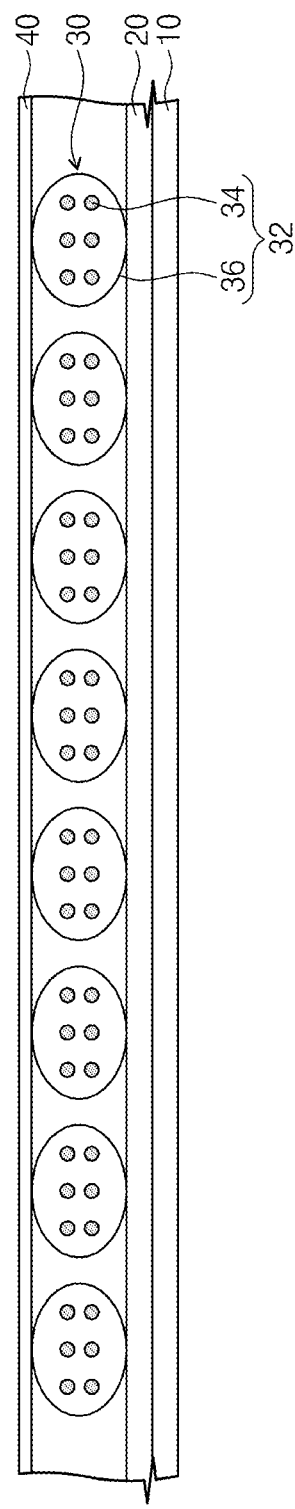

Referring to FIG. 12, the adhesive layer 40 is formed on the optic switching layer 30. The adhesive layer 40 may be formed of polymer by a spin coating process, a PVD process, or a CVD process.

Referring to FIG. 2 again, the adhesive layer 40 is bonded to the passivation layer 50. Even though not shown in the drawings, a sealant may be formed on edges of the first and second substrates 10 and 100, so that the first and second substrates 10 and 100 may be fixed. The organic light-emitting layer 80 and the optic switching layer 30 may be fixed by the bonding of the first and second substrates 10 and 100.

According to embodiments of the inventive concept, the dual mode display device includes the first substrate, the second electrode opposite to the first electrode, the third electrode between the first and second electrodes, the optic switching layer between the first and third electrodes, and the organic light-emitting layer between the second and third electrodes. The organic light-emitting layer may display the image of the self-light-emitting mode. The self-light-emitting mode display device may be effectively driven in the dark room. The organic light-emitting layer may include the transparent organic material. One of the first and second electrodes is the transparent electrode, and the other is the reflecting electrode. The reflecting electrode and the optic switching layer may display the image of the reflection mode. The image of the reflection mode may be shown by the external light. The reflection mode display device may be driven in the bright space. The dual mode display device of the self-light-emitting mode and the reflection mode may minimize the energy consumption. Thus, the dual mode display device according to embodiments of the inventive concept may improve productivity.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A dual mode display device comprising:
   a first substrate through which an image is projected;
   a first electrode disposed over the first substrate and covering an entire upper surface of the first substrate;
   a second substrate disposed over and opposite to the first electrode and the first substrate;
   a second electrode disposed between the second substrate and the first electrode and covering an entire lower surface of the second substrate to reflect external light in a reflection mode and reflect internally generated light in a self-emitting mode, the second electrode overlapping with the first electrode;
a third electrode disposed between the first electrode and the second electrode;
an optic switching layer disposed between the first electrode and the third electrode; and
an organic light-emitting layer disposed between the second electrode and the third electrode,
wherein the first electrode is a cathode electrode to apply a first negative voltage to the optic switching layer, the second electrode is a cathode electrode to apply a second negative voltage to the organic light-emitting layer, and the third electrode is a common anode electrode to apply a positive voltage to the first electrode and the second electrode.

2. The dual mode display device of claim 1, further comprising:
a passivation layer disposed between the third electrode and the optic switching layer.

3. The dual mode display device of claim 2, further comprising:
an adhesive layer disposed between the passivation layer and the optic switching layer.

4. The dual mode display device of claim 3, wherein the adhesive layer includes a polymer film.

5. The dual mode display device of claim 2, further comprising:
a thin film transistor part adjacent to the third electrode and disposed between the passivation layer and the organic light-emitting layer.

6. The dual mode display device of claim 1, wherein the optic switching layer includes photonic crystal capsules.

7. The dual mode display device of claim 1, wherein the optic switching layer includes electronic-ink microcapsules.

8. The dual mode display device of claim 1, wherein the optic switching layer includes a liquid crystal layer.

9. The dual mode display device of claim 1, wherein the first electrode is a transparent electrode; and
wherein the second electrode is a reflecting electrode.

10. The dual mode display device of claim 1, wherein:
the first electrode passes the external light and the reflected external light in the reflection mode, and passes the internally generated light in the self-emitting mode;
the second electrode reflects the external light toward the first substrate in the reflection mode and reflects the internally generated light toward the first substrate in the self-emitting mode;
the optic switching layer passes or blocks the external light in the reflection mode and the internally generated light in the self-emitting mode; and
the organic light-emitting layer passes the external light and the reflected external light in the reflection mode, and emits the internally generated light in the self-emitting mode.

11. The dual mode display device of claim 1, wherein the second electrode is disposed on the organic light emitting layer to cover a substantially entire upper surface of the organic light emitting layer.

12. The dual mode display device of claim 7, wherein at least one of electronic-ink microcapsules includes electronic-ink particles that are dispersed in the electronic-ink microcapsule and block the external light in the reflection mode and the internally generated light in the self-emitting mode when an electric field is applied between the first electrode and the third electrode.

13. A dual mode display device comprising:
a first substrate;
a second substrate disposed over and opposite to the first substrate, the second substrate through which an image is projected;
a first reflecting electrode disposed over the first substrate and covering an entire upper surface of the first substrate to reflect external light in a reflection mode and reflect internally generated light in a self-emitting mode;
a second transparent electrode disposed between the second substrate and the first reflecting electrode and covering an entire lower surface of the second substrate, the second transparent electrode overlapping with the first reflecting electrode;
a third electrode disposed between the first reflecting electrode and the second transparent electrode;
an optic switching layer disposed between the first reflecting electrode and the third electrode; and
an organic light-emitting layer disposed between the second transparent electrode and the third electrode,
wherein the first reflecting electrode is a cathode electrode to apply a first negative voltage to the optic switching layer, the second transparent electrode is a cathode electrode to apply a second negative voltage to the organic light-emitting layer, and the third electrode is a common anode electrode to apply a positive voltage to the first electrode and the second electrode.

14. The dual mode display device of claim 13, wherein:
the first reflecting electrode reflects the external light toward the second substrate in the reflection mode and reflects the internally generated light toward the second substrate in the self-emitting mode;
the second transparent electrode passes the external light and the reflected external light in the reflection mode, and passes the internally generated light in the self-emitting mode;
the optic switching layer passes or blocks the external light in the reflection mode and the internally generated light in the self-emitting mode; and
the organic light-emitting layer passes the external light and the reflected external light in the reflection mode, and emits the internally generated light in the self-emitting mode.

15. The dual mode display device of claim 1, wherein the third electrode overlaps with the first electrode and the second electrode.

16. The dual mode display device of claim 13, wherein the third electrode overlaps with the first reflecting electrode and the second transparent electrode.

* * * * *